United States Patent
Srocka

(10) Patent No.: US 7,265,571 B2
(45) Date of Patent: Sep. 4, 2007

(54) METHOD AND DEVICE FOR DETERMINING A CHARACTERISTIC OF A SEMICONDUCTOR SAMPLE

(75) Inventor: Bernd Srocka, Berlin (DE)

(73) Assignee: Accent Optical Technologies Nanometrics, Inc., Milpitas, CA (US)

(*) Notice: Subject to any disclaimer, the term of this patent is extended or adjusted under 35 U.S.C. 154(b) by 0 days.

(21) Appl. No.: 10/549,088

(22) PCT Filed: Mar. 11, 2004

(86) PCT No.: PCT/EP2004/002508

§ 371 (c)(1),
(2), (4) Date: Sep. 13, 2005

(87) PCT Pub. No.: WO2004/081592

PCT Pub. Date: Sep. 23, 2004

(65) Prior Publication Data

US 2006/0192573 A1   Aug. 31, 2006

(30) Foreign Application Priority Data

Mar. 14, 2003   (DE) ................ 103 11 658

(51) Int. Cl.
*G01R 31/26* (2006.01)
*G01R 31/302* (2006.01)
*G01N 21/47* (2006.01)
*G01N 21/55* (2006.01)

(52) U.S. Cl. .............. 324/766; 324/752; 356/446; 356/447

(58) Field of Classification Search .......... 324/752, 324/766; 356/446–447
See application file for complete search history.

(56) References Cited

U.S. PATENT DOCUMENTS

| | | | |
|---|---|---|---|
| 5,025,145 A | 6/1991 | Lagowski | |
| 5,177,351 A | 1/1993 | Lagowski | |
| 5,663,657 A | 9/1997 | Lagowski et al. | |
| 6,512,384 B1* | 1/2003 | Lagowski et al. | 324/752 |
| 6,526,372 B1 | 2/2003 | Orschel et al. | |
| 7,026,831 B2* | 4/2006 | Hermes | 324/752 |

FOREIGN PATENT DOCUMENTS

| | | |
|---|---|---|
| JP | 5-226445 A | 9/1993 |
| WO | WO-00/02058 A1 | 1/2000 |
| WO | WO-03/098197 A1 | 11/2003 |

\* cited by examiner

*Primary Examiner*—Ha Tran Nguyen
*Assistant Examiner*—Roberto Velez
(74) *Attorney, Agent, or Firm*—Silicon Valley Patent Group, LLP

(57) ABSTRACT

The invention relates to a method for determining a characteristic of a semiconductor sample forming a surface. The method comprises the steps: simultaneously illuminating an area on the surface of a semiconductor sample with superimposed exciting light beams with a plurality of wavelengths, modulating the light beam of the different wavelengths with the same frequency, but different phases, selecting a modulation function and its phases in such a way, that the sum of the photon fluxes of all light beams at all times lies within a tolerance range, the tolerance range being considerably smaller than the sum of all photon fluxes, simultaneously phase-dependent measuring of the components of the surface photo voltage caused by the different light beams and determining the characteristic of the semiconductor sample from the relationships between the components and the respective wavelengths. Furthermore a device for carrying out such a method is described.

6 Claims, 3 Drawing Sheets

METHOD AND DEVICE FOR DETERMINING A CHARACTERISTIC OF A SEMICONDUCTOR SAMPLE

TECHNICAL FIELD

Figure 1:
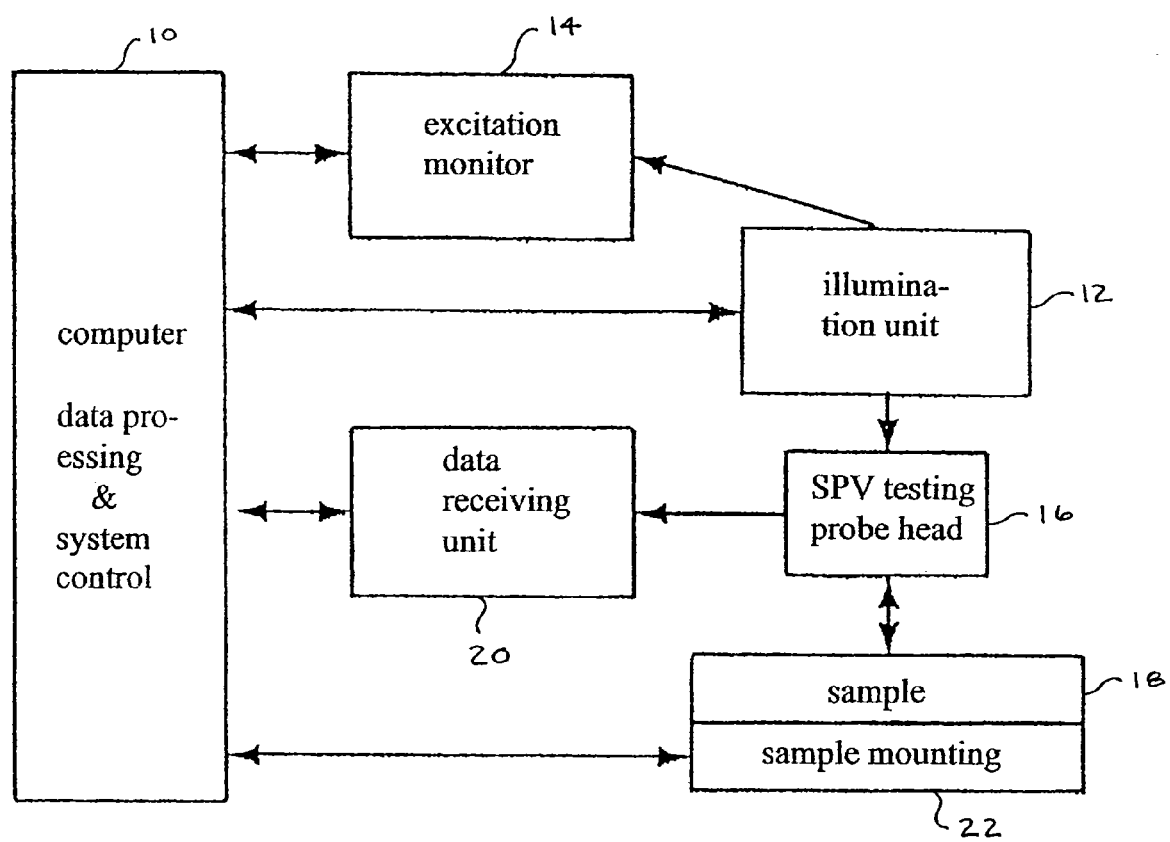

The invention relates to a method for determining a characteristic of a semiconductor sample forming a surface.

Furthermore the invention relates to a device for determining a characteristic of a semiconductor sample, comprising: means for mounting a semiconductor sample forming a surface, a plurality of light sources with different wavelengths each of the light sources generating a light beam, means for superimposing such light beams for the generation of an combined light beam simultaneously comprising the wavelengths of all light sources and falling on an area of the surface of the semiconductor sample, modulating means for modulating the light sources with different modulating functions, means for measuring the surface photo voltage generated in the area of the surface and exhibiting a signal distribution, and signal evaluation means for determining the signal distribution components of the surface photo voltage based on the various light beams with various wavelengths on the basis of the modulating functions of the various light sources.

The quality of semiconductor materials such as silicon must be monitored during the production of material and chips. An important material parameter is the diffusion length of minority charge carriers. Such diffusion length represents the average effective distance, over which excess charge carriers diffuse through a semiconductor during their life time. This diffusion length is heavily influenced by impurities and crystal disorders. Therefore the diffusion length of the minority charge carriers is a suitable measure of the degree of the impurity in the semiconductor material and of the crystalline perfection. The effective diffusion length, which is influenced by the surface characteristics has to be distinguished from the inner diffusion length, which is based on an unlimited sample.

For the quality check of semiconductor materials a quick, nondestructive and reliable determination of the diffusion length of minority charge carriers is desireable.

A conventional method of determining of this diffusion length of minority charge carriers as well as the velocity of the surface recombination of semiconductor materials is based on the measurement of the surface photovoltage (SPV). The method makes use of the effect, that after exciting of a semiconductor sample with light having photonenergies which are higher than the energy gap of the semiconductor, pairs of electrons and holes are formed. A certain amount of such charge carriers can reach the space charge area at the surface and are separated causing a voltage drop at the surface. This is the surface photo voltage SPV. For the determination of the diffusion length this surface photo voltage is measured when it is illuminated with different light wavelengths. As the excitation with different wavelengths causes the generation of excess charge carriers in the inner part of the semiconductior sample of different depths, the amount of excited charge carriers reaching the surface varies with the exciting wavelength. Assuming the excitation is effected with a small injection level, small frequencies of the light modulation and diffusion lengths of the charge carriers, which are small with respect to the sample thickness a simplified expression for the state of equilibrium can be derived (for example D. Schroder, "Semiconductor Materials and Device Characterization", John Wiley & Sons, 1990, S.379):

$$\Delta V_{SPV} \propto \Delta n = \Phi_{eff} \frac{1}{S + \frac{D}{L}} * \frac{1}{1 + \frac{z}{L}}.$$

Therein $\Delta n$ denotes the excess charge carrier-concentration at the edge of the space charge area, $\Phi_{eff} = \Phi*(1-R)$ the effective photon flux entering the semiconductor sample and derived from the incident photon flux $\Phi$ taking into account the reflectivity R at the sample surface, S the velocity of the frontside surface recombination, z the penetration depth of the light, D the diffusion constant of the minority charge carrier and L the diffusion length of the minority charge carrier of the sample. Using this expression the diffusion length is derived from the measurement of the voltage change $\Delta V_{SPV}$ of the surface voltage due to the excitation with modulated light of various light sources.

If the velocity of the backward surface recombination cannot be neglected, because the diffusion length of the minority charge carriers reaches the range of the thickness of the semiconductor sample, the relationship can be derived according to the above mentioned book by D. Schroder, page 425 ff:

$$\Delta V_{SPV} \propto (1-R)\Phi \frac{S_f}{C} * \frac{1}{1-z^2/L^2} \left[ \left(z\frac{S_b}{D} - 1\right)(\cosh [T/L] - \exp [-T/z]) + \left(\frac{z}{L} - \frac{S_b L}{D}\right)\sinh [T/L] \right]$$

wherein $C = (S_f S_b L/D + D/L)\sin h[T/L] + (S_f + S_b)\cos h[T/L]$.

R denotes the reflectivity at the frontside of the semiconductor sample, $\phi$ the incident photon flux, $S_f$ and $S_b$ the front and rear velocity of the surface recombination, z the penetration depth of the light, L the diffusion length of the minority charge carriers, D the diffusion constant of the minority charge carriers and T the thickness of the semiconductor sample.

PRIOR ART

Known methods based on the measurement of the surface photo voltage use the above first mentioned, simplified relationship.

With one of such methods the level of the generated surface photo voltage is kept constant. The principle of such a method is described in a publication by Goodman et al. "A method for the measurement of short minority carrier diffusion lengths in semiconductors" in the Journal, "J. Appl. Phys." Vol. 33, p.2750, 1961.

The photon flux and the surface photo voltage are measured with different wavelengths according to different photo energies. The photon flux is changed in such a way, that a constant surface photo voltage is obtained for each wavelength. The different photon fluxes obtained with different photon energies are plotted against the reciprocal absorption coefficient. This graph is then linearity extrapolated and the point of intersection of the extrapolated graph with the abscissa is determined for the determination of the diffusion length of the minority charge carriers.

This is also described in the U.S. Pat. No. 5,177,351 A as the state of the art.

In a different kind of such a method the photon flux is kept constant.

Such a method is already described as prior art in the U.S. Pat. No. 5,663,657 A.

The U.S. Pat. No. 5,025,145 A describes such a method, wherein first the induced photo voltage is measured for different photon fluxes to ensure a linear relationship between the surface photo voltage and the photon flux. Then the photo voltage is measured for a number of selected photon energies, i.e. wavelengths with light with a constant photon flux having a value in the linear range. The surface photo voltages obtained in such a way having monotonously increasing photon energies are plotted as a function versus the reciprocal values of the absorption coefficients according to the given photon energies. The diffusion length of the minority charge carriers is determined by extrapolation for determining the reciprocal absorption coefficient for a (modulated) surface photo voltage equal to zero.

Both methods are based on the above mentioned simplified model requiring a linear relationship between the photon flux required for a constant surface photo voltage or the surface photo voltage, respectively, on one hand and the penetration depth of the light. The use of such a model allows the determination of the frontside surface recombination and the diffusion length. The influence on the rear side of the semiconductor sample is normally ignored or the results are corrected in an again simple way using a factor depending on the thickness of the semiconductor sample.

As the optical excitation with different wavelengths is carried out sequentially, both methods are relatively slow. Furthermore, the "CMSPV"-method operating with constant surface photo voltage has the disadvantage that for each wavelength the photon flux hast to be newly adjusted in order to obtain the given photo voltage. Even if this is carried out by a seperate control circuit, this causes further slowdown. The speed of the measurement is of crucial importance, if the surface of a semiconductor sample needs to be scanned point by point for a plurality of points.

Furthermore the sequential measurements of the surface photo voltage for the different wavelengths cause systematic errors. The state of the surface is changed by the measurement itself. Thereby the accuracy of the method is limited. The velocity of the surface recombination even depends on the intensity of the optical excitation, i.e. on the photon flux incident on the surface of the semiconductor sample. As at least a portion of the surface states exhibit a relatively slow recombination, a hysteresis effect occurs. This violates the assumption of the simplified model that all data points for the different wavelengths are obtained under the same surface conditions.

The WO 00/02058 (=DE 198 31 216 A1) describes a method for determining the dependency of the surface photo voltage on the wavelength. Therein the wavelength is periodically changed over a wavelength range at a certain frequency. The surface photo voltage changing in accordance therewith is measured. From the obtained measured signal the components with a plurality of frequencies are determined by means of fourier transformation. These components are corrected with respect to the frequency response and phase response of the measurement set up. From the such determined components the surface photo voltage is determined by signal processing.

From the U.S. Pat. No. 6,512,384 B1 a method for the determination of the diffusion length of minority charge carriers is known, wherein the surface photo voltage at each investigated position of the semiconductor sample measurements are carried out simultaneously for a plurality of wavelengths of the exciting light. In such known method the surface of the semiconductor sample is excited with a light beam composed of superimposed photon fluxes with different wavelengths. From the measured surface photo voltage the components with the different modulation frequencies are filtered. Thereby the speed of the measurement is considerably increased.

This known method, however, does not avoid the errors caused by the dependency of the surface recombination on the intensity. As a modulation with different frequencies causes a variation of the entire photon flux between zero and the total amount of all photon fluxes of the superimposing wavelength light sources, the state of the surface also then considerably changes during the measuring process.

DISCLOSURE OF THE INVENTION

It is an object of the invention, to carry out the measurement at each point of a semiconductor sample with a method for the determination of the diffusion length of minority charge carriers or equivalent characteristics of a semiconductor sample quicker and more accurate.

More precisely it is an object of the invention to ensure essentially the same surface states for a method of such kind wherein the investigated point is excited with light of different wavelengths and wherein the surface photo voltages obtained for the different wavelengths are determined.

According to the invention this object is achieved with a method of the above mentioned kind with the method steps:

(a) simultaneously illuminating an area on the surface of a semiconductor sample with superimposed exciting light beams with a plurality of wavelengths, (b) modulating the light beam of the different wavelengths with the same frequency, but different phases, (c) selecting a modulation function and its phases in such a way, that the sum of the photon fluxes of all light beams at all times within a tolerance range, the tolerance range being considerably smaller than the sum of all photon fluxes, (d) simultaneously phase-dependent measuring of the components of the surface photo voltage caused by the different light beams and (e) determining the characteristic of the semiconductor sample from the relationships between the components and the respective wavelengths.

Based on this method a device for determining a characteristic of semiconductor sample, comprising: means for mounting a semiconductor sample forming a surface, a plurality of light sources with different wavelengths each of the light sources generating a light beam, means for superimposing such light beams for the generation of a combined light beam simultaneously comprising the wavelengths of all light sources and falling on an area of the surface of the semiconductor sample, modulating means for modulating the light sources with different modulating functions, means for measuring the surface photo voltage generated in the area of the surface and showing a signal distribution, and signal evaluation means for determining the signal distribution components of the surface photo voltage based on the various light beams with various wavelengths by means of the modulating functions of the various light sources, as shown in the U.S. Pat. No. 6,512,384 B1, the invention provides modulation means operating with the same frequencies for all light sources, the modulation means operating with phase shifts among the different light sources and the modulation functions and its phases being selected in such a way that the sum of all photon fluxes lies within a tolerance range, which is considerably smaller than the sum of the photon fluxes.

With the method according to the invention and the device according to the invention the measurements are carried out simultaneously for all exciting wavelengths as in the U.S. Pat. No. 6,512,384 B1, so that the measuring time is shortened. However, the difference between the components of the obtained signal distribution of the surface photo voltage based on the different wavelengths are distinguished not by their frequency which is used to modulate the different wavelengths or light sources, but their modulation phase. The modulation frequency is the same for all wavelengths. Thereby it is possible to select the phases of the different modulations in such a way that the entire photon flux is approximately constant. Therefore the measurement is always carried out under the same conditions in this respect. The errors occurring due to variations of the photon flux for different modulation frequencies are avoided.

Further aspects of the invention are subject matter of the subclaims.

An embodiment of the invention is described below in greater detail with reference to the accompanying drawings.

FIG. 1 is a block diagram and schematically shows a device for checking a semiconductor sample with modulated light of different wavelengths and for measuring the surface photo voltage.

Figure 2:
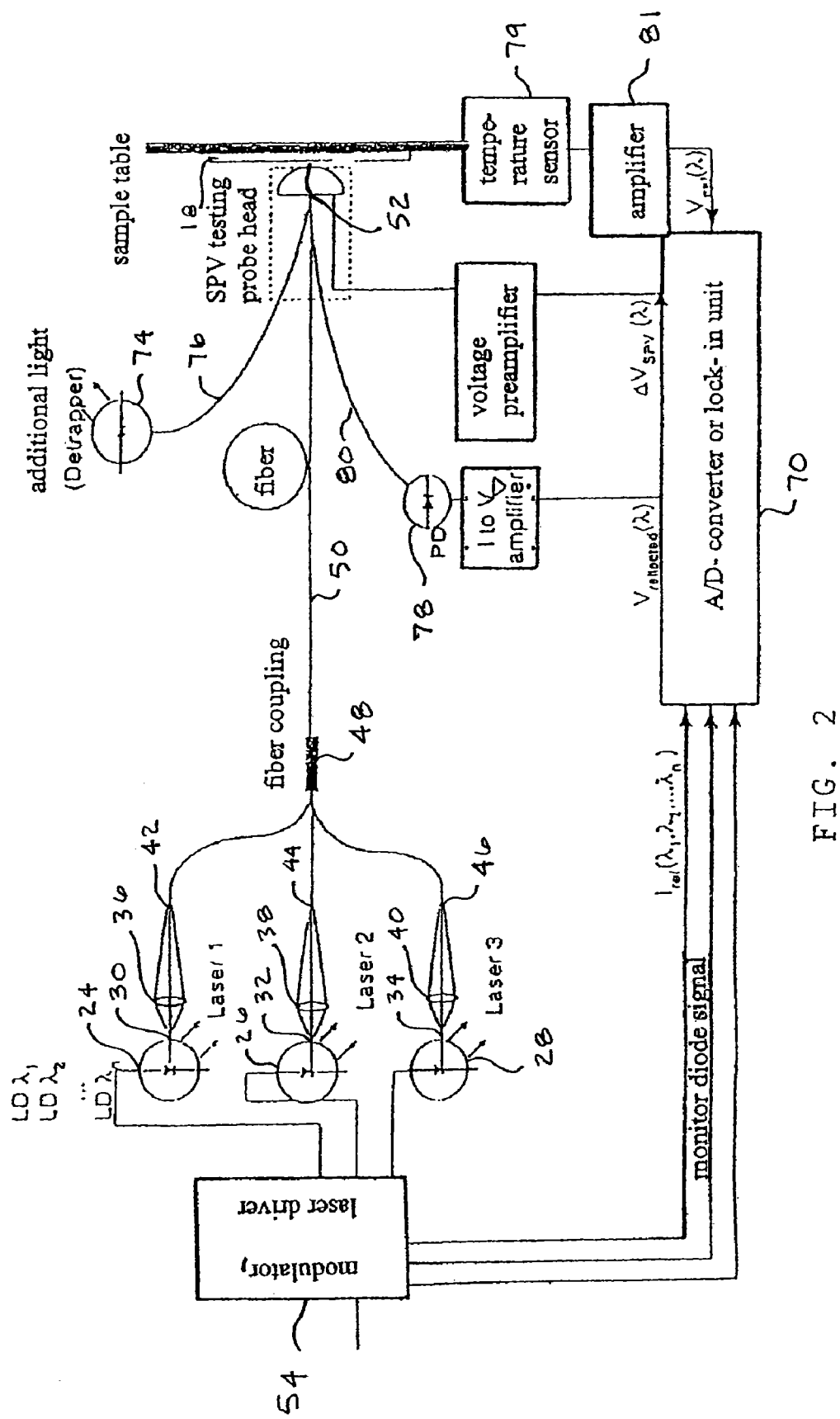

FIG. 2 schematically shows the set up of a device for illuminating the semiconductor sample with modulated light of different wavelengths and for measuring the surface photo voltage.

Figure 3:
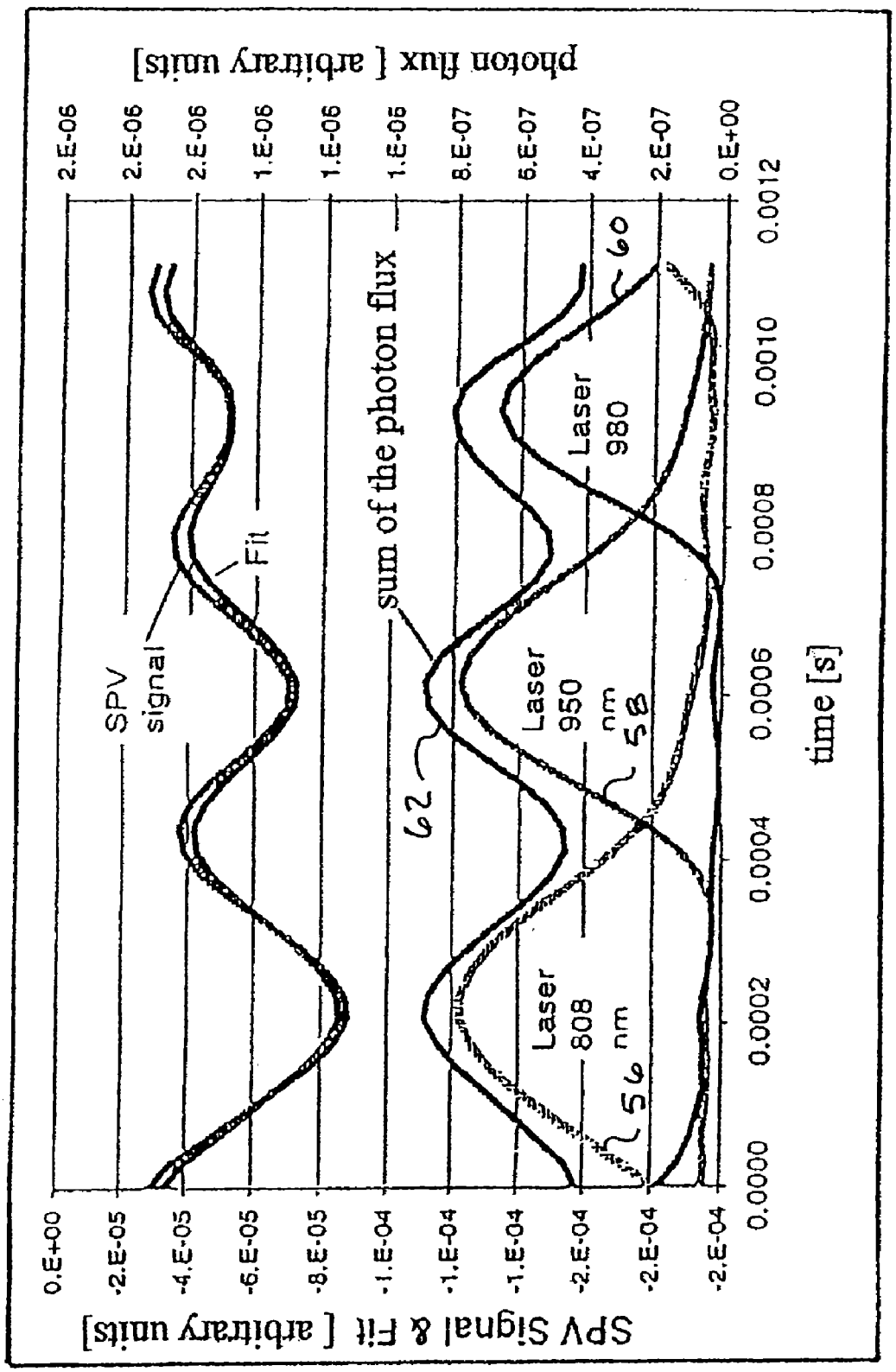

FIG. 3 shows the distribution of the surface photo voltages generated with a device according to FIG. 2 by three light beams of different wavelengths modulated with different phases.

In FIG. 1 numeral 10 denotes a computer for data processing and controlling the computer 10 controls an illumination unit 12. The illumination unit 12 generates, as described below, three light beams with different wavelengths, which are modulated with the same frequency but with different phases. The light beams and their modulation are monitored by an excitation monitor 14. The excitation monitor provides the distribution of the photon fluxes of the three light beams. Such distributions are switched on the computer 10 for the data processing. A testing probe 16 measures the surface photo voltage generated by excitation with the light beams at one point of a semiconductor sample 18. The distribution of this surface photo voltage is fed to the computer 10 via a data receiving unit 20. The semiconductor sample 18 is mounted on a sample table 22 which is moveable under the control of the computer 10 for scanning the surface of the semiconductor sample 18.

The set up is schematically shown in FIG. 2. The sample 18 is illuminated at a measuring point by a plurality of light sources. In FIG. 2 three such light sources 24, 26, and 28 are shown. The light sources 24, 26 and 28 form the illumination unit 12 in FIG. 1. The light sources 24, 26 and 28 are preferably laser diodes or luminescent diodes. The light sources emit light beams 30, 32, 34 with different wavelengths. The light beams 30, 32, 34 are each collimated by a collimating optics 36, 38 and 40, respectively, on end surfaces of fibers 42, 44 and 46, respectively. A fiber coupler 48 superimposes the light beams guided in the fibers 42, 44 and 46. The superimposing light beams are then guided through a fiber 50 to a measuring point 52 on the surface of the semiconductor sample 18.

The testing probe 16 measures the surface photo voltage at the measuring point 52 on the surface of the semiconductor sample 18. Such testing probes are well known to the person skilled in the art and are, therefore, not described here in greater detail.

A modulator assembly 54 modulates the light emission of the light sources 24, 26 and 28 and, thereby, the photon flux of the light beam 30, 32 and 34, respectively. The modulation is carried out periodically with the same frequency for all light beams 30, 32 and 34. The modulation function, however, are phase shifted amongst each other. FIG. 3 shows a preferred form of a modulation function and the respective distribution of the surface photo voltage generated thereby. The modulation functions essentially correspond to oneway-rectified sine functions, i.e. the positive half-waves of the sine function. The modulation functions are essentially zero between the positive half-waves. In FIG. 3 numeral 56 denotes the modulation function or the corresponding surface photo voltage of the light source 24. Numeral 58 is the modulation function of the light source 26 and numeral 60 denotes the modulation function of the light source 28. The three modulation functions 56, 58 and 60 are phase-shifted by 120° relative to the frequency of the modulation functions. For any number n of light sources the phase shifts preferably is $2\pi/n$. In FIG. 3 numeral 62 denotes the sum of the photon fluxes or surface photo voltages, respectively. It can be seen, that the photon flux of the superimposed light beams, i. e. the sum of the photon fluxes of all light beams, at all times lies within a tolerance range, which is considerably smaller than the sum of the photon fluxes. Thereby approximately constant illumination conditions for all wavelengths are obtained at the measuring point 52. By the selection of the modulation functions 56, 58, 60 a rest wave structure is obtained for the sum of the photon fluxes and the surface photo voltage SPV. This facilitates the attribution of the different components of the surface photo voltage to the individual light sources 24, 26, 28 and thereby to the different wavelengths.

The modulation functions are fed to a quick A/D-converter or a plural lock-in-circuit 70 by a modulator assembly 54 with lines 64, 66 and 68. The lock-in-circuit 70 receives the surface photo voltage from a voltage amplifier. The lock-in-circuit 70 forms a part of the data receiving unit 20 and provides signals at the computer 10 according to the different modulated light sources 24, 26 and 28 and the components of the surface photo voltage caused by the corresponding wavelengths of the exciting light.

A constant, non-modulated photon flux is guided to the measuring point 52 from a light source 74 and a fiber 76 or a bundle of fibers. This photon flux only provides a non-modulated component of the surface photo voltage. It does not generate a modulated signal with the modulation frequency and therefore does not disturb the result of the measurement. This non-modulated photon flux can be used to saturate surface states or traps for minority charge carriers over the entire thickness of the semiconductor sample 18.

A photo detector 78 receives light through a bundle 80 of fibers which is reflected at a measuring point 52 from the surface of the semiconductor sample 18. From the photon flux incident from the fiber 50 and the photon flux reflected on the surface of the semiconductor sample 18 the effective photon flux actually entering the semiconductor sample can be determined. The signal of the photodetector 78 is fed to the lock-in-circuit 70 through an amplifier.

A temperature sensor 79 measures the temperature of the semiconductor sample 18. The signal of the temperature sensor 79 is fed to the computer 10 or the lock-in-circuit 70, respectively, through an amplifier 81.

The described assembly operates as follows:

The exciting photon flux $\phi_{exc}(t)$ entering the semiconductor sample is $$\Phi_{exc}(t) = \Phi_{bias} + \sum_{j=1}^{n} \Phi_j * M(t) * \exp(i\varphi_j) * T_{reflex}(\lambda_j)$$

wherein $\phi_{bias}$ is the photon flux of the background light, $\phi_j$ and $\phi_j$ representing the amplitude and the phase shift of the light beam at the wavelength j, M(t) is the modulation function used for modulating the light sources 24, 26, and 28 and $T_{reflex}(\lambda_j)$ the reflection correction for the $j^{th}$ wavelength due to the reflection of the surface of the semiconductor sample 18. The letter i denotes the imaginary number.

The reflection correction $T_{reflex}(\lambda_j)$ is calculated from the simultaneously measured portion of the exciting light which is reflected from the surface of the semiconductor sample 18 into the bundle of fibers 80. At the end of the bundle of fibers 80 a photo detector with a large detection area detects the light. The electrical signal generated from the photo detector 78 is finally fed to the computer 10 through an amplifier 82. By suitable adjustment of the transmission function of the bundle 80, the characteristics of the photo detector 78 and the reflection of the optics of the SPV testing probe head before the automatized measuring process the actual reflected light at each measuring point 52 of the semiconductor sample 18 at each used wavelength can be determined and can be used to correct the photon flux. The exciting photon flux $\phi_{exc}$, the photon flux penetrating the semiconductor sample, is computed from the incident photon flux $\phi_j$ for each wavelength.

The simultaneous measurement of the reflected light renders the assembly and the method independent from the theoretical photon flux corrections.

In a modified embodiment the light reflected at the surface of the semiconductor sample can be directly measured within the testing probe head by means of a suitable beam splitter in the form of a partial beam derived from the main beam.

The amplitudes and phases of the signals of surface photo voltages generated by exciting with n wavelengths are simultaneously measured with the testing probe 16 in connection with the data receiving unit 20 and fed to the computer 10 for further signal processing. the data receiving unit 20 is a quick analogue-digital-converter, which scans the signal of the surface photo voltage with a scanning rate which is higher than 2 nf, wherein f is the modulation frequency. In order to improve the signal-to-noise ratio and to ensure that all components of the different wavelengths are exposed to the same scanning conditions, the signal is detected over a plurality of the modulation frequency and stored. After the detection of the data the signal distribution for extracting the diffusion length is processed. The signal distribution is smoothed by suitable means, for example a digital filter applied to the signal in the computer program, to reject noise components not belonging to the surface photo voltage. The signal can also be averaged zu a signal distribution, in such a way that finally a final signal distribution is obtained with a window of one modulation period, i.e. a window with a time interval of 1/f.

The computer 10 is fed with a signal representing the change of the surface photo voltage by excitation with the superimposed, modulated light beams 24, 26, 28:

$$\Delta V_{SPV}(t) = \sum_{j=1}^{n} \Phi_j * M(t) * \exp(i\varphi_j) * T_{reflect}(\lambda_j) * T_{SPV}(\lambda_j)$$

Therein M(t) is the signal distribution of the driver signal of the modulator assembly which is used to modulate the light source 24, 26 and 28, i.e the j=$1^{st}$, j=$2^{nd}$ and j=$3^{rd}$ light source, i.e. the above mentioned modulation function, $\phi_j$ denotes the phase shift of the $j^{th}$ exciting beam 30, 32, 34, i.e. the j=$1^{st}$, j=$2^{nd}$ and j=$3^{rd}$ exciting beam, $T_{reflex}$ denotes the correction function taking into account the light reflected at the surface of the semiconductor sample 18 and $T_{SPV}$ is the modification by which the effect caused by the surface photo voltage itself is taken into account. The transmission function $T_{reflex}(\lambda_j)$ resulting from the light reflected for each wavelength measured with the photo detector 78 as described above is a correction factor for the amplitude of the $j^{th}$ excitation beam. In the embodiment of FIG. 2 the distribution M(t) of the modulation function is provided by the modulator assembly 54 controlling the light sources according to such a synthetically derived function. The distribution M(t) also can be measured from the light emitted by the light sources 24, 26 and 28.

The effect of the surface photo voltage $T_{SPV}(\lambda_j)=A_{SPV}(\lambda_j)\exp(i\Psi_j)$ represents a change of the amplitude and the phase of each component with the corresponding wavelength. The relationship between the exciting photon flux and the change of the surface photo voltage caused thereby is given by a real "adjustment factor" $A_{SPV}$ and a phase shift $\Psi$. The surface of the semiconductor sample operates in a similar way as a time function element with capacitor and resistor. The above equation can be written as:

$$\Delta V_{SPV}(t) = \sum_{j=1}^{n} \Phi_j * M(t) * \exp(i\varphi_j) * T_{reflex}(\lambda_j) * A_{SPV}(\lambda_j) * \exp(i\psi_j)$$

By adapting the amplitudes $A_{SPV}(\lambda_j)$ and the phase shifts $\exp(i\Psi_j)$ the signal distribution resulting from the superposition of the modulation frequencies with the corresponding photon fluxes of the different wavelengths can be adapted to the measured signal $\Delta V_{SPV}$ of the surface photon voltage. Practically the graphs 56, 58 and 60 ($\phi_j M(t)$) corrected with respect to the wavelength dependent reflectivity, are changed in amplitude and phase according to a certain algorithm until the sum of the obtained signal distribution coincides with the measured distribution of the modulation $\Delta V_{SPV}$ of the surface photon voltage. The graph 90 in FIG. 3 shows the adaption to the thus obtained graph distribution. The graph 92 shows the measured distribution of the surface photon voltage.

The thus obtained values for the phase shift $\Psi_j$ can be used to correct the amplitude of the surface photon voltage SPV with respect to the dependency of the modulation frequency. (Nakhmanson "Solid State Electronics" 1975, Vol 18, P. 617).

The corrected values $A^*_{SPV}(\lambda_j)$ directly are the relationships between the photon fluxe and the amplitude of the surface photon voltage SPV for the $j^{th}$ wavelength. Thereby the diffusion length L of the minority charge carriers can be determined for each measuring point directly from $A^*_{SPV}(\lambda_j)$.

Two computation methods can be applied:

The approximation for short diffusion lengths uses the above mentioned relationship $$\Delta V_{SPV} \propto \Delta n = \Phi_{eff} \frac{1}{S + \frac{D}{L}} * \frac{1}{1 + \frac{z}{L}}$$

This relationship is valid, if the diffusion length is shorter than about half the thickness of the sample. If two wavelengths are assumed the values $A_1$ and $A_2$ represent the relationships $\Delta V_{SPV-1}/\phi_1$ and $\Delta V_{SPV-2}/\phi_2$. L can be derived therefrom using the above equation as $$L = \left(\frac{A_2}{A_1} z_2 - z_1\right) / \left(1 - \frac{A_2}{A_1}\right),$$

wherein $z_j$ are the penetration depths at the $j^{th}$ wavelength.

As mentioned above this approximation for short wavelengths is only valid for a relative to the diffusion length large thickness of the semiconductor sample. However, today high quality semiconductor material has a diffusion length comparable with the thickness of the semiconductor sample or even larger than that. In such a case the effect of the rear surface recombination has to be taken into account by fitting the results into the above mentioned more general equation. At first the signal $\Delta V_{SPV}$ is normalized to for example the signal occurring at the shortest wavelength $\lambda_{min}$. This normalization provides:

$$\Delta V_{SPV} norm(\lambda) = \frac{\Delta V_{SPV}(\lambda)}{\Delta V_{SPV}(\lambda_{min})}$$

By such a normalization the above given prefactor C is eliminated. With the normalized signal (the adding of the term "norm" being omitted) results in:

$$\frac{\frac{\Delta V_{SPV}(\lambda)}{\Phi_{eff}(\lambda)}}{\frac{\Delta V_{SPV}(\lambda_1)}{\Phi_{eff}(\lambda_1)}} \propto$$

$$\frac{L^2}{L^2-z^2}\left[\left(z\frac{S_b}{D}-1\right)\left(\cosh\left[\frac{T}{L}\right]-\exp\left[\frac{-T}{z}\right]\right)+\left(\frac{z}{L}-\frac{S_bL}{D}\right)\sinh\left[\frac{T}{L}\right]\right]$$

R is the reflectivity on the front side of the semiconductor sample 18, $S_b$ is the velocity of the surface recombination on the rear side, z is the penetration depth of the light, L is the diffusion length of the minority charge carriers, D is the diffusion constant of the minority charge carrier and T is the thickness of the semiconductor sample 18.

If n values $A_1, A_2, \ldots A_n$ are used (i.e. $\Delta V_{SPV-1}/\phi_1$, $\Delta V_{SPV-2}/\phi_2, \ldots \Delta V_{SPV-n}/\phi_n$), as they result from the measurement for the ratios $\Gamma_j = A_j/A_1$, i.e. for the values $A_j$ normalized against $A_1$ it is obtained $$\Gamma_j \propto \frac{L^2}{L^2-z_j^2} * \left[\left(z_j\frac{S_b}{D}-1\right)\left(\cosh\left[\frac{T}{L}\right]-\exp\left[\frac{-T}{z_j}\right]\right)+\left(\frac{z_j}{L}-\frac{S_bL}{D}\right)\sinh\left[\frac{T}{L}\right]\right].$$

If L and $S_b$ are taken as free adaption parameters the diffusion length and the rear velocity of the surface recombination can be derived from the n-1 equations resulting from the above expression. This method is not dependent on any assumptions about the rear velocity of the surface recombination. As an additional parameter, i.e. $S_b$, is directly derived from the measurement at least three wavelengths are needed for this method.

The invention claimed is:

1. Method for determining a characteristic of a semiconductor sample having a surface, comprising:
   (a) simultaneously illuminating an area on the surface of a semiconductor sample with superimposed exciting light beams with a plurality of different wavelengths,
   (b) modulating the light beams of different wavelengths with the same frequency, but different phases,
   (c) selecting a modulation function and phases of the modulation function, wherein the modulation function sums photon fluxes of all light beams at all times within a tolerance range, and wherein the tolerance range is less than the sum of all photon fluxes,
   (d) simultaneously phase-dependent measuring of the components of the surface photo voltage caused by the different light beams, and
   (e) determining a characteristic of the semiconductor sample based on the relationships between the components and the respective wavelengths, and outputting the determined characteristic;
   wherein the characteristic to be determined is the diffusion length of minority charge carriers, and the determination of the diffusion length of the minority charge carriers is determined by fitting value pairs of surface photo voltage $\Delta V_{SPV}$ and wavelengths $\lambda$ or the penetration depth z of the light into the equation $$\frac{\frac{\Delta V_{SPV}(\lambda)}{\Phi_{eff}(\lambda)}}{\frac{\Delta V_{SPV}(\lambda_1)}{\Phi_{eff}(\lambda_1)}} \propto$$

$$\frac{L^2}{L^2-z^2}\left[\left(z\frac{S_b}{D}-1\right)\left(\cosh\left[\frac{T}{L}\right]-\exp\left[\frac{-T}{z}\right]\right)+\left(\frac{z}{L}-\frac{S_bL}{D}\right)\sinh\left[\frac{T}{L}\right]\right]$$

wherein $S_b$ is the velocity of the rear surface recombination, L is the diffusion length of the minority charge carriers, D is the diffusion constant of the minority charge carriers and T is the thickness of the semiconductor sample.

2. The method of claim 1 wherein the intensity distribution of the different light beams is measured and used for determining the respective components of the surface photo voltage.

3. The method of claim 1 wherein the photon flux reflected from the surface of the semiconductor sample is measured for the determination of the effective photon flux really penetrating the semiconductor.

4. The method of claim 1 wherein the temperature of the semiconductor is measured, and the method further comprises compensating for the dependence of the wavelength dependent penetration depth of the photon flux based on the temperature.

5. The method of claim 1 wherein:
(a) the modulation of each light beam is carried out with a modulation function essentially corresponding to the positive half-waves of a sine function, and
(b) the modulation function of the different light beams are phase shifted by essentially $2\pi/n$ relative to the modulation frequency which is the same for all light beams, wherein n denotes the overall sum of the superimposed light beams.

6. The method of claim 1 further comprising moving the semiconductor step-by-step relative to the superimposed light beams.

* * * * *